United States Patent
Iwata (10) Patent No.: US 8,377,255 B2
(45) Date of Patent: Feb. 19, 2013

(54) PLASMA PROCESSING APPARATUS AND METHOD OF CONTROLLING DISTRIBUTION OF A PLASMA THEREIN

(75) Inventor: Manabu Iwata, Nirasaki (JP)

(73) Assignee: Tokyo Electron Limited, Tokyo (JP)

(*) Notice: Subject to any disclaimer, the term of this patent is extended or adjusted under 35 U.S.C. 154(b) by 385 days.

(21) Appl. No.: 12/686,630

(22) Filed: Jan. 13, 2010

(65) Prior Publication Data

US 2010/0176086 A1   Jul. 15, 2010

Related U.S. Application Data

(60) Provisional application No. 61/163,561, filed on Mar. 26, 2009.

(30) Foreign Application Priority Data

Jan. 14, 2009   (JP) ................................. 2009-006000

(51) Int. Cl.
*H01L 21/306* (2006.01)
*C23F 1/00* (2006.01)
*C23C 16/00* (2006.01)

(52) U.S. Cl. ............ 156/345.44; 156/345.47; 118/723 E (58) Field of Classification Search ............ 156/345.43–345.47; 118/715, 118/722, 723 R, 723 E; 315/111.21
See application file for complete search history.

(56) References Cited

U.S. PATENT DOCUMENTS 7,967,930 B2 * 6/2011 Lewington et al. ............. 156/51
2006/0254717 A1 * 11/2006 Kobayashi et al. ...... 156/345.44

FOREIGN PATENT DOCUMENTS

JP  2000-323456  11/2000
JP  2004-363552  12/2004

* cited by examiner

*Primary Examiner* — Maureen Gramaglia
(74) *Attorney, Agent, or Firm* — Rothwell, Figg, Ernst & Manbeck, P.C.

(57) ABSTRACT

A plasma processing apparatus performing a plasma processing to a substrate includes a processing vessel having a vacuum exhaustible processing chamber; a mounting table serving as a lower electrode for mounting thereon the substrate in the processing chamber; a circular ring member arranged to surround a periphery of the substrate whose radial one end portion is supported by the mounting table; an upper electrode arranged above the lower electrode to face same; and a power feed for supplying the mounting table with a high frequency power. The plasma processing apparatus further includes a first intermediate electrical conductor supporting a middle portion of the circular ring member; and a first movable electrical conductor which is selectively electrically connected or disconnected to the power feed; and a second intermediate electrical conductor supporting a radial opposite end portion of the circular ring member.

9 Claims, 5 Drawing Sheets

PLASMA PROCESSING APPARATUS AND METHOD OF CONTROLLING DISTRIBUTION OF A PLASMA THEREIN

CROSS-REFERENCE TO RELATED APPLICATION

This application claims the benefit of priority to Japanese Patent Application No. 2009-006000, filed on Jan. 14, 2009, the entire contents of which are incorporated herein by reference.

FIELD OF THE INVENTION

The present invention relates to a plasma processing apparatus for performing a plasma processing on a substrate; and, more particularly, to a plasma processing apparatus including a unit for changing a potential of intermediate conductors included therein. Further, the present invention relates to a method of controlling distribution of a plasma generated in a processing chamber by switching a path of high frequency power used in generating the plasma.

BACKGROUND OF THE INVENTION

In a manufacturing process of semiconductor devices or a flat panel device (FDP), a plasma processing apparatus is widely used as an apparatus for performing etching, depositing, oxidizing, sputtering or the like. In the plasma processing apparatus, e.g., a plasma etching apparatus, an upper and a lower electrode are arranged in parallel in a processing chamber or an reactor; and a substrate to be processed (semiconductor wafer, glass substrate, or the like) is loaded on the lower electrode and a high frequency voltage for generating a plasma is applied to the upper or the lower electrode via a matching unit.

In general, a number of gas injection holes are provided on the upper electrode and an etching gas is injected from the injection holes over the entire upper surface of the substrate, thereby etching the surface of the substrate to be processed by a plasma of the etching gas.

Generally, an upper and a lower electrode of a parallel plate type plasma etching apparatus are disposed parallel to each other and a high frequency voltage for generating a plasma is applied to the upper or the lower electrode. Then, electrons accelerated by the high frequency electric field generated between the electrodes, and secondary electrons and thermal electrons emitted from the electrodes collide with and ionize molecules of processing gas, thereby generating a plasma of the processing gas. Thus, a required micromachining, e.g., an etching on a surface of the substrate, is executed by radicals and/or ions in the plasma.

Further, as semiconductor integrated circuits become finer and finer, the plasma processing is required to be conducted by using a high density plasma at a low voltage condition. For example, in a capacitively coupled plasma processing apparatus, high efficiency, high density, and low bias of the plasma processing are needed. Moreover, as the size of the semiconductor chip and the diameter of the substrate to be processed are getting larger, there are needed a plasma of a larger scale and thus a greater chamber (processing vessel).

However, in such a large-scaled plasma, an intensity of electric field at the center portion of an electrode (upper or lower electrode) tends to be greater than that at the peripheral portion thereof. As a result, there is a problem that a plasma density is higher at the center portion of the electrode than at the peripheral portion thereof, and thus resistivity of the plasma is low at the center portion of the electrode. As a consequence, a current concentrates at the center portion of the opposite electrode and the uniformity of the plasma density becomes worse.

Additionally, as the chamber gets larger, there is caused a problem that a plasma density becomes different at the center portion and at the peripheral portion of the substrate due to influence from a flow of the processing gas in an actual etching process.

The nonuniformity of the plasma density leads to discrepancies in an etching rate of the substrate, which may result in deteriorating a throughput of devices obtained from the peripheral portion of the substrate.

To address these problems, there have been various researches for a structure of the electrode. In order to cope with them, there is known a technology in which a central portion of a main surface of the high frequency electrode is made of a highly resistive material (see, e.g., Japanese Patent Application Publication No. 2000-323456). In this technology, the central portion of the main surface (a surface to which a plasma contacts) of the electrode to which a high frequency power supply is connected, is formed with the highly resistive material which dissipates larger high frequency power by joule heat. Therefore, an intensity of electric field on the main surface of the electrode is relatively lower at the center portion thereof than at the peripheral portion thereof, thereby correcting the nonuniformity in the plasma density.

Meanwhile, there is disclosed a plasma processing apparatus in which a dielectric is embedded in a main surface of an electrode facing a processing space (see, e.g., Japanese Patent Application Publication No. 2004-363552). In this technology, a uniformity of the plasma density is improved by making impedance of a high frequency power, which is radiated from the main surface of the electrode to the processing space, relatively large at the center portion of the electrode and relatively small at the peripheral portion thereof.

However, if the central portion of main surface of the high frequency electrode is formed by the highly resistive material in the above-mentioned high frequency discharging type plasma processing apparatus, there is a problem that dissipation of the high frequency power by joule heat (energy loss) is increased.

Further, since characteristics of the impedance distribution over the main surface of the electrode are fixed by a material and a shape profile of the dielectric in the above technology in which the dielectric is embedded in the main surface of the electrode, there is a drawback that it cannot adaptively deal with various processes or process conditions.

SUMMARY OF THE INVENTION

In view of the above, the present invention provides a plasma processing apparatus capable of improving a uniformity and throughput of plasma processing by controlling distribution characteristics of plasma density.

In accordance with a first aspect of the present invention, there is provided a plasma processing apparatus performing a plasma processing to a substrate, including a processing vessel having a vacuum exhaustible processing chamber; a mounting table serving as a lower electrode for mounting thereon the substrate in the processing chamber; a circular ring member arranged to surround a periphery of the substrate whose radial one end portion is supported by the mounting table; an upper electrode arranged above the lower electrode to face same; and a power feed for supplying the mounting table with a high frequency power.

The plasma processing apparatus further includes a first intermediate electrical conductor supporting a middle portion of the circular ring member; a second intermediate electrical conductor supporting a radial opposite end portion of the circular ring member; and a first movable electrical conductor which is selectively electrically connected or disconnected to the power feed.

In accordance with a second aspect of the present invention, there is provided a method of controlling distribution of a plasma in a plasma processing apparatus including a process vessel having a vacuum exhaustible processing chamber; a mounting table for mounting a substrate in the processing chamber; a circular ring member arranged to surround a periphery of the substrate whose radial one end portion is supported by the mounting table; a power feed for supplying the mounting table with a high frequency power, and performing a plasma processing onto the substrate by using a plasma generated in the processing chamber.

The method includes controlling the distribution of the plasma generated in the processing chamber, by selectively electrically connecting or disconnecting a first intermediate electrical conductor supporting a middle portion of the circular ring member to the power feed via a first movable electrical conductor, and changing a path supplying the high frequency power. Further, the first intermediate electrical conductor and the first movable electrical conductor are disposed in a space hermetically isolated from the processing chamber inside the processing vessel. Moreover, a radial opposite end portion of the circular ring member is supported by a second intermediate electrical conductor.

BRIEF DESCRIPTION OF THE DRAWINGS

The objects and features of the present invention will become apparent from the following description of preferred embodiment, given in conjunction with the accompanying drawings, in which.

DETAILED DESCRIPTION OF THE EMBODIMENTS

Hereinafter, a plasma processing apparatus serving as an etching apparatus in accordance with an embodiment of the present invention will be described in detail with reference to accompanying drawings which form a part hereof, but the invention is not limited thereto.

Figure 1:
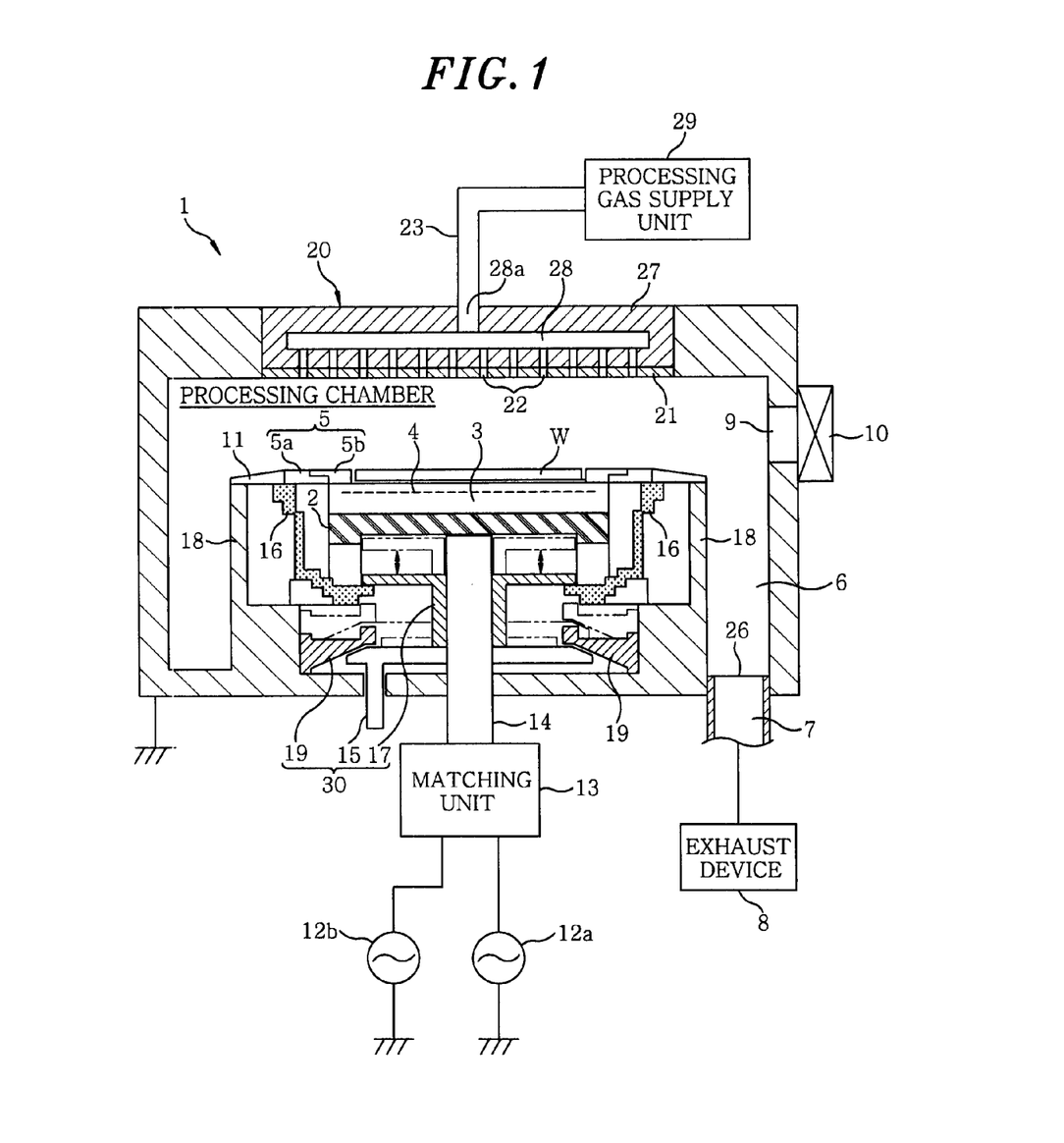
FIG. 1 is a vertical cross sectional view showing a configuration of a plasma processing apparatus in accordance with an embodiment of the present invention.

FIG. 1 schematically shows a configuration of a plasma processing apparatus in accordance with the embodiment of the present invention. The plasma processing apparatus includes a cylindrical vessel 1 having therein an air-tightly sealed processing chamber and made of, e.g., aluminium, stainless steel or the like. In the embodiment, although there will be explained a capacitively coupled plasma processing apparatus in which two frequencies are applied to a lower electrode, the present invention is not limited thereto, but may be applied in a plasma processing apparatus wherein a single frequency is applied.

A susceptor 2 which supports a substrate to be processed, e.g., a semiconductor wafer W (referred to as 'wafer W' hereinafter), is horizontally arranged in a processing chamber of the processing vessel 1. The susceptor 2 is made of a conductive material, e.g., aluminium, and serves as a RF electrode. An electrostatic chuck 3 made of a dielectric such as a ceramic is provided on an upper surface of the susceptor 2 and holds the wafer W by electrostatic adsorbing force. An inner electrode 4 made of an electrical conductor, e.g., a conductive film of copper, tungsten or the like, is embedded in the electrostatic chuck 3.

The electrostatic chuck 3 serves as a heat exchanging plate contacting with the wafer W and exchanging heat therewith to thereby adjust the temperature of the wafer W. A focus ring 5 is arranged to surround a periphery of the wafer W. In this embodiment, the focus ring 5 is of 2 split type including an outer focus ring 5a and an inner focus ring 5b. However, the present invention is not limited thereto and the focus ring may of a conventional single ring type. Further, the focus ring 5 can be made of one of various materials, e.g., Si, SiC, C, $SiO_2$ and the like, depending on the wafer W.

An annular exhaust path 6 is formed between a sidewall of the vessel 1 and an outer wall of a tubular supporting unit (intermediate electrical conductor) 18 and an exhaust port 26 is provided at a bottom portion of the annular exhaust path 6. An exhaust device 8 is connected to the exhaust port 26 via an exhaust pipe 7. The exhaust device 8 has a vacuum pump, e.g., a turbo molecular pump or the like, which can reduce a pressure of the plasma processing space in the vessel 1 to a desired vacuum level. A gate valve 10 is attached to the outside wall of the chamber 1, which opens and closes a transfer port 9 to transfer the wafer W.

Connected to the central portion of a rear (lower) surface of the susceptor 2 is an upper end of a cylindrical or a tubular power feed 14, which is upwardly and perpendicularly elongated from an output terminal of a matching unit 13 disposed down therebelow. In this embodiment where two frequency powers are applied to the lower electrode, a first and a second high frequency power supply 12a and 12b are electrically connected to the susceptor 2 via the matching unit 13 and the power feed 14. The power feed 14 is made of an electrical conductor, e.g., copper, aluminium or the like.

The first high frequency power supply 12a outputs a relatively high first high frequency, e.g., 60 MHz, largely contributing in generating the plasma above the susceptor 2. The second high frequency power supply 12b outputs a relatively low second high frequency, e.g., 2 MHz, mainly contributing in attracting ions to the wafer W on the susceptor 2. The matching unit 13 has a first and a second matcher therein. The first matcher matches impedances of the first high frequency power supply 12a and a load (mainly, the electrodes, plasma and chamber), while the second matcher matches impedances of the second high frequency power supply 12b and the load.

The electrostatic chuck 3 is formed in a manner that the inner electrode 4 made of a sheet or mesh shaped conductor is embedded in a film or plate shaped dielectric. Further, the electrostatic chuck 3 is integrally formed on or adhered to the susceptor 2. The inner electrode 4 is electrically connected to a DC power supply provided outside the vessel 1 and a power feed line (e.g., a coated wire), and is applied with a DC voltage from the DC power supply. Accordingly, the electrostatic chuck 3 can adsorb and hold the wafer W by Coulomb force.

At a ceiling portion of the vessel 1, a shower head is provided to face the susceptor 2 in parallel. The shower head also serves as an upper electrode 20. The upper electrode 20 has an electrode plate 21 and an electrode supporting member 27 which detachably supports the electrode plate 21 from above. A gas chamber 28 is provided inside the electrode supporting member 27. In the electrode supporting member 27 and the electrode plate 21, there are provided a number of gas injection openings 22 formed from the gas chamber 28 to the susceptor 2. Thus, a plasma generating space or processing space is formed between the electrode plate 21 and the susceptor 2.

A gas supply line 23 from a processing gas supply unit 29 is connected to a gas inlet opening 28a provided at an upper portion of the gas chamber 28. The electrode plate 21 is made of, e.g., Si or SiC, and the electrode supporting member 27 is made of, e.g., an alumite-processed aluminium.

In the plasma processing apparatus in accordance with the embodiment, two movable electrical conductors 17 and 19 supported by a movable mechanism 15 made of an insulator is accommodated in a space hermetically isolated from the processing chamber in which a plasma processing of the wafer W is conducted. Accordingly, even when extremely fine dust is generated by the movements of the movable electrical conductors 17 and 19, it is prevented from entering and contaminating the processing chamber.

The movable electrical conductors 17 and 19 are moved in unison by a movable mechanism 15. The movable electrical conductor 17 is always electrically connected to the power feed 14. Further, the movable electrical conductors 17 and 19 are electrically connected to and disconnected from an intermediate conductor 16, respectively, when the movable electrical conductors 17 and 19 are moved down to their lowest positions.

Meanwhile, another intermediate electrical conductor is grounded. The movable electrical conductor 19 is always electrically connected to the intermediate electrical conductor 18. The movable electrical conductors 19 and 17 are electrically connected to and disconnected from the intermediate electrical conductor 16 at thus grounds some when the movable electrical conductors 19 and 17 are moved up to their uppermost positions by the movable mechanism 15.

That is, by controlling the intermediate electrical conductor 16 to selectively make electrical connection to one of the movable electrical conductors 17 and 19 by the movable mechanism 15, a path applying the high frequency power can be readily changed. Here, the movable electrical conductors 17 and 19, and the movable mechanism 15 constitute a movable power supply mechanism 30.

Figure 2:
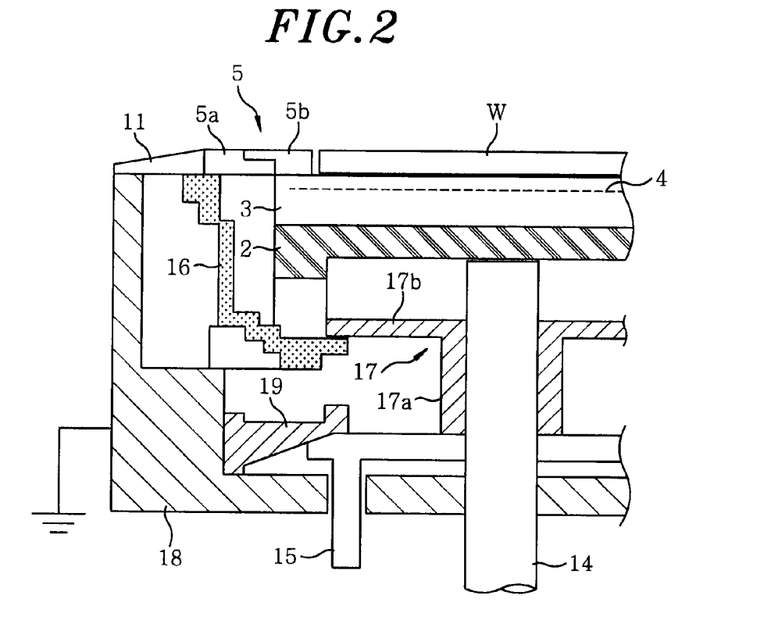
FIG. 2 illustrates a state (first state) in which a movable mechanism is lowered down to the lowermost position thereof.
Figure 4:
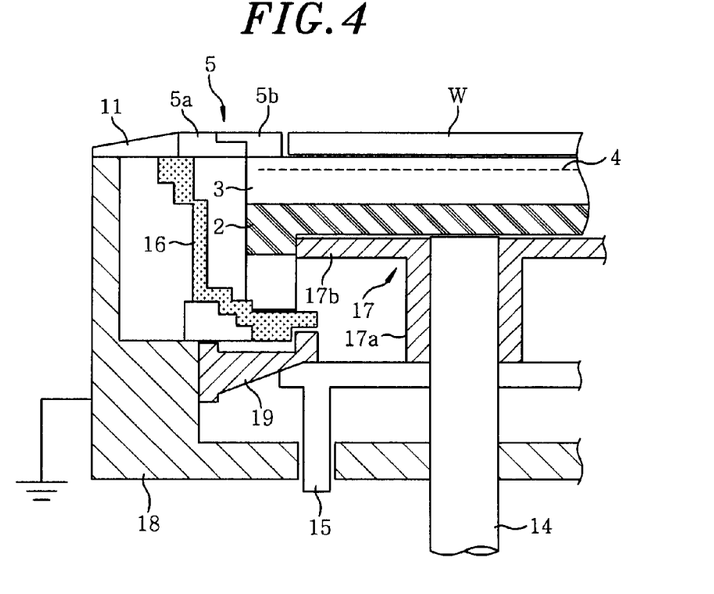
FIG. 4 depicts a state (second state) in which the movable mechanism is raised up to the uppermost position thereof.

The movable power supply mechanism 30 is illustrated in detail in FIGS. 2 and 4. FIG. 2 depicts a state (first state) where the movable member 15 is lowered down to the lowermost position, while FIG. 4 depicts a state (second state) where the movable member 15 is raised up to the uppermost position.

Referring FIG. 2, the power feed 14 is electrically connected to the rear surface of the susceptor 2. The movable electrical conductors 17 and 19 are provided in a space below the susceptor 2. They have a structure capable of slidably moving in an up and down direction (axial direction) along the inner surfaces of the space under the susceptor 2 by the movable member 15. The power feed 14 is electrically connected to the intermediate electrical conductor 16 via the movable electrical conductor 17, such that an electrical resistance between the power feed 14 and the intermediate electrical conductor 16 is preferably made as small as possible.

The intermediate electrical conductor 16 is an intermediate supporting member supporting an annular member, e.g., the focus ring 5, in the vessel 1. The intermediate electrical conductor 18 is, e.g., the tubular supporting unit supporting an annular member, e.g., a pressing member 11. The intermediate electrical conductor 18 is preferably grounded. Here, the focus ring 5 and the pressing member 11 constitute a circular ring member.

Figure 6A:
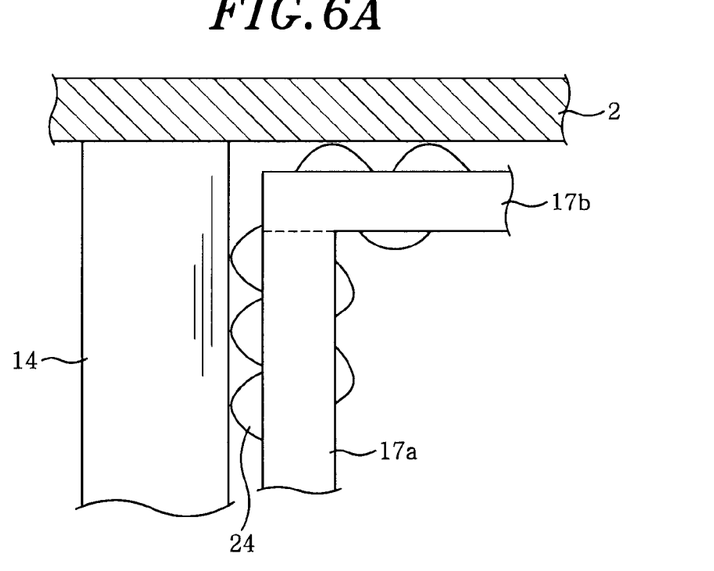
FIGS. 6A and 6B are partial vertical cross sectional views showing a power feed and fixed electrical conductors in contact with movable electrical conductors having multi contacts, in accordance with the present invention.
Figure 6B:
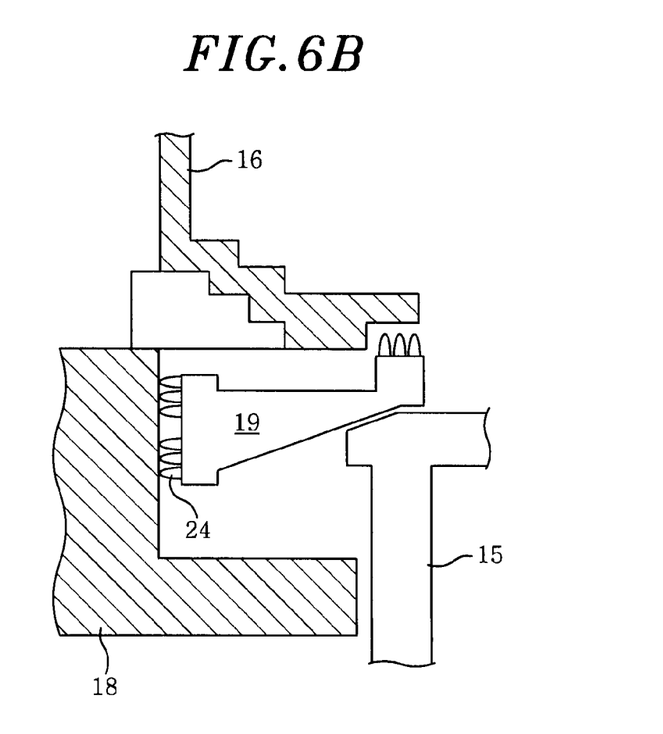

FIGS. 6A and 6B show states that the power feed 14 and the intermediate electrical conductors 16 and 18 contact with the movable electrical conductors 17 and 19, respectively. In FIG. 6A, the movable electrical conductor is made of, e.g., copper or aluminium, and has a cylindrical center portion 17a annularly surrounding an outer periphery of the power feed 14 and a radial portion 17b horizontally elongated from the cylindrical center portion 17a outwards. In this example shown in FIG. 1, the lower portion of the cylindrical center portion 17a is supported by the movable mechanism 15. Multiple contacts 24 may be preferably provided on an inner surface of the cylindrical center portion 17a to reduce a contact resistance with the power feed 14.

Besides, the cylindrical center portion 17a of the movable electrical conductor 17 has a structure that it can be moved along the power feed 14 perpendicularly. Further, on the upper and the lower surface of the radial portion 17b, multiple contacts 24 having a certain size are provided. Thus, a fixed gap is kept between the radial portion 17b and the intermediate electrical conductor 16 when the radial portion 17b is at its lowermost position.

Likewise, a predetermined gap is maintained between the radial portion 17b and the rear surface of the susceptor 2 when the radial portion 17b is at its uppermost position. The electrical connection between the radial portion 17b and the intermediate electrical conductor 16 and that between the radial portion 17b and the susceptor 2 are established by the multiple contacts 24.

In FIG. 6B, the movable electrical conductor 19 is made of, e.g., copper or aluminium, and has a generally ring shape extending horizontally. The outer periphery of the movable electrical conductor 19 is formed conformal to the inner periphery of the intermediate electrical conductor 18 and an inner peripheral portion of the movable electrical conductor 19 is supported by the movable mechanism 15. The movable electrical conductor 19 is partially provided with the multiple contacts 24 having a certain size.

Specifically, in this example shown in FIG. 6B, the multiple contacts 24 are provided on an outer peripheral surface of the movable electrical conductor 19. Thus, the outer peripheral surface of the movable electrical conductor and the inner peripheral surface of the intermediate electrical conductor 18 are always electrically connected via the multiple contacts 24, while a certain gap is kept therebetween. Further, the multiple contacts 24 are also provided on an upper surface of the peripheral portion of the movable electrical conductor 19 contacting with the intermediate electrical conductor 16.

Thus, the electrical connection between the movable electrical conductor 19 and the intermediate electrical conductor 16 is made by the multiple contacts 24, while a certain gap is kept therebetween. The multiple contacts on the movable electrical conductor 17 and the movable electrical conductor 19 are all made of an electrically conductive material having a low resistivity.

The movable member 15 has an electric motor generating a rotational driving force and a motion converting mechanism converting the rotational driving force of the electric motor into a perpendicularly linear motion driving force. A linear motion part of the motion converting mechanism is coupled to bottom surfaces of the cylindrical center portion 17a and the movable electrical conductor 19.

Figure 3:
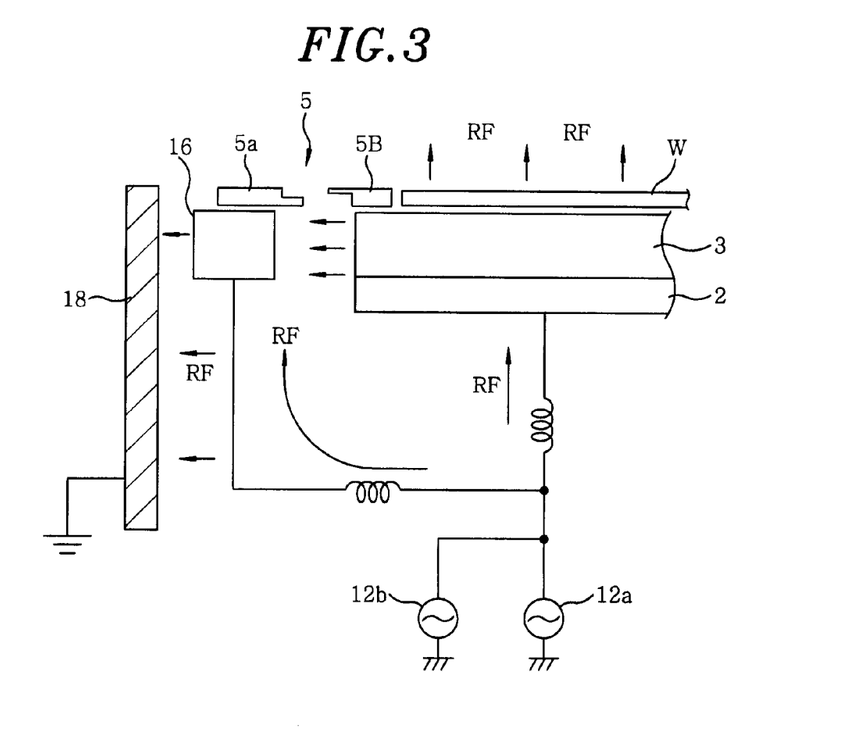
FIG. 3 schematically shows an equivalent circuit of a dual frequency power supply mechanism at the time when the movable mechanism is in the state of FIG. 2.

FIG. 3 schematically illustrates an equivalent circuit of the dual frequency power supply mechanism when the movable electrical conductors 17 and 19 are in the first state as shown in FIG. 2.

In case of the first state, since the intermediate electrical conductor 16, which is connected to the bottom of the outer peripheral portion of the outer focus ring 5a as shown in the example of FIG. 2, is connected to the high frequency power supplies 12a and 12b by the movable electrical conductor 17, the outer periphery and the inner periphery of the focus ring 5 has the equi-potential (the inner periphery of the focus ring 5 being disposed directly on the electrostatic chuck 3 and the susceptor 2). Therefore, the high frequency does not flow therebetween, and, thus, the focus ring 5 is not heated. In other words, the high frequency powers are supplied not only through a path from the high frequency power supply 12a and 12b to the susceptor 2 via the power feed 14 but also through a bypass path from the power feed 14 to the intermediate electrical conductor 16 via the movable electrical conductor 17.

FIG. 4 shows the second state when the movable electrical conductor 17 and 19 are raised up to the uppermost position. The second state is referred to the state that, by the elevation of the movable electrical conductor 15, the radial portion 17b of the movable electrical conductor 17 is electrically connected to the bottom surface of the susceptor 2 and the movable electrical conductor 19 is electrically connected to the intermediate electrical conductors 18 and 16. Therefore, the intermediate electrical conductor 16 is grounded.

In this embodiment, 2-split type focus ring is used which includes the outer and the inner focus ring 5a and 5b. As a result, the radially outermost end of the outer focus ring 5a is grounded. Meanwhile, the outermost end of the inner focus ring 5b has the potential of the power supply side (i.e., the same potential as the electrostatic chuck 3). As a result, high frequency current flows between the innermost and the outermost ends of the outer focus ring 5a and thus the outer focus ring 5a is heated. Further, high frequency current does not flow through the inner focus ring 5b and thus the temperature thereof is maintained at approximately same temperature as that of the susceptor 2.

Figure 5:
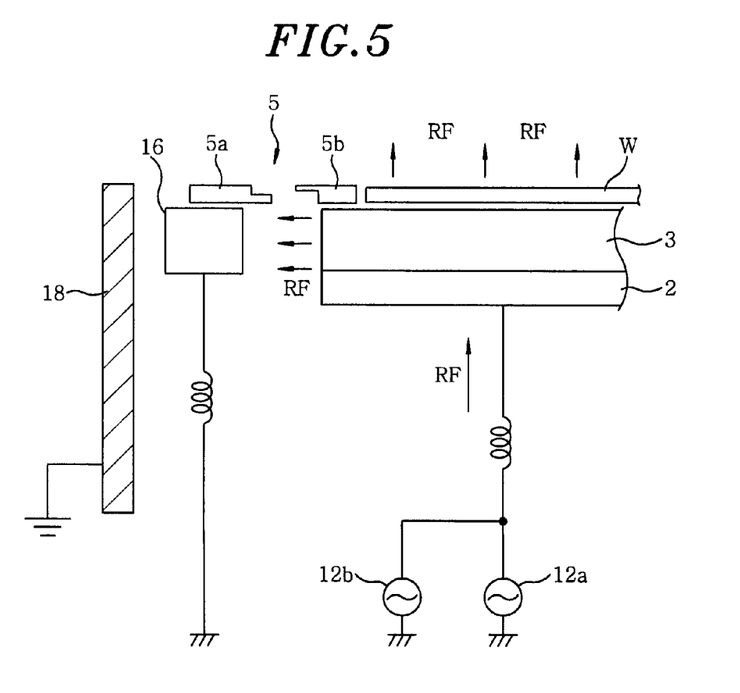
FIG. 5 schematically shows an equivalent circuit of the dual frequency power supply mechanism at the time when the movable electrical conductor is in the state of FIG. 4.

FIG. 5 schematically shows an equivalent circuit of dual frequency power supply mechanism while the movable electrical conductors 17 and 19 are in the second state (a position which the movable mechanism 15 is raised up to the uppermost position).

In such a case, the movable electrical conductor 17 is electrically connected to the susceptor 2 and the movable electrical conductor 19 is connected to the intermediate electrical conductor 16. Since the intermediate electrical conductor 16 is connected to the ground via the movable electrical conductor 19, all the high frequency powers from the high frequency power supplies 12a and 12b are supplied to the susceptor 2 via the power feed 14 and high frequency current flows through the outer focus ring 5a. Therefore, the outer focus ring 5a is heated.

Figure 7:
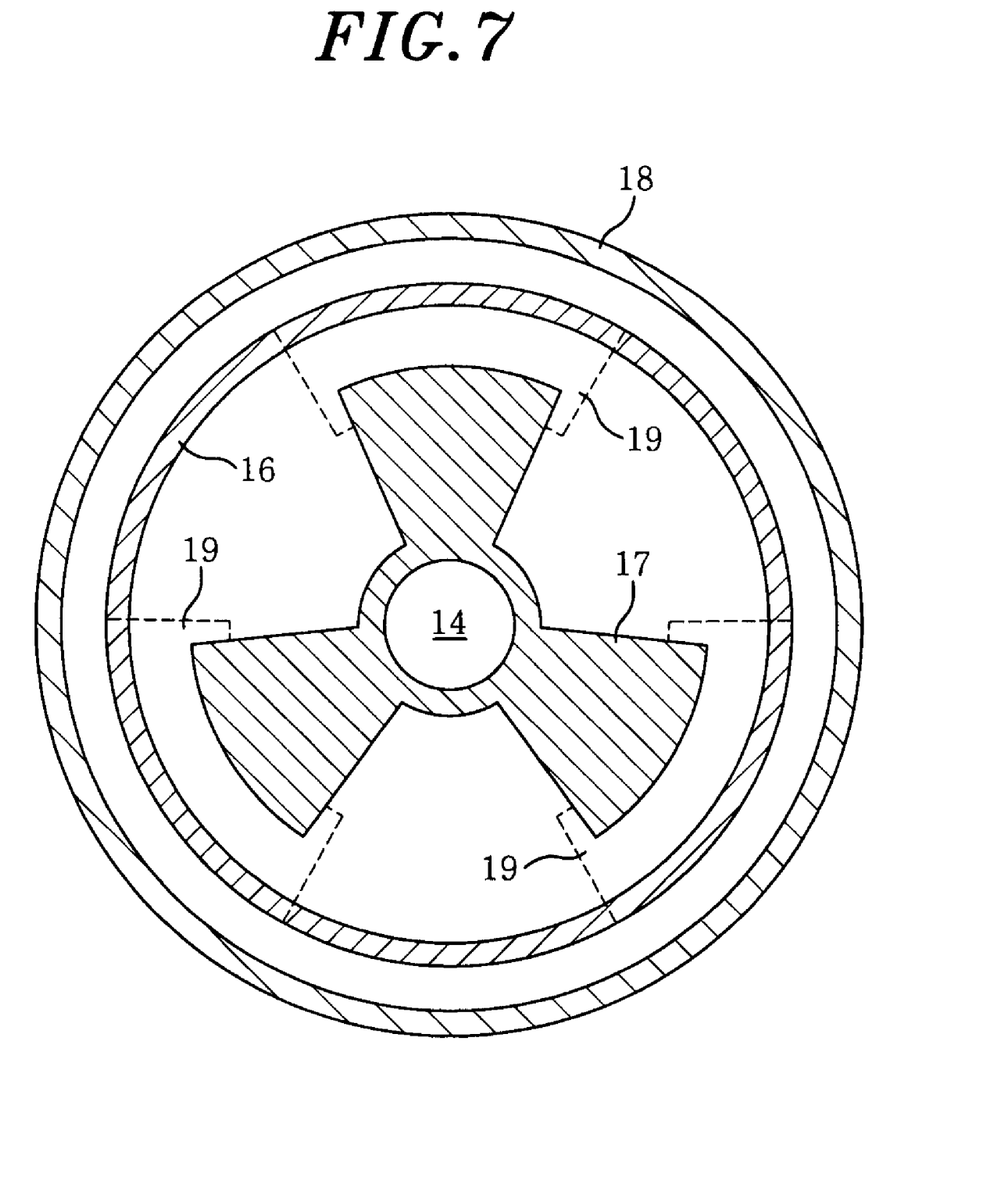
FIG. 7 illustrates a horizontal cross sectional view of the plasma processing apparatus in accordance with the present invention.

FIG. 7 schematically shows a horizontal cross sectional view of the plasma processing apparatus in accordance with the embodiment. The intermediate electrical conductor 16 is arranged radially inside the intermediate electrical conductor 18 serving as the tubular supporting unit.

The power feed 14 is arranged at the center of the vessel 1. The movable electrical conductor 17 moves up and down while being axially connected to the power feed 14. Further, the movable electrical conductor 17 has a shape which includes three parts formed to radially extend from the center. However, the present invention is limited to this example. For example, the movable electrical conductor 17 may be formed with 4 or more split plates. Besides, it may be formed not by split plates, but by punching holes in a circular plate through which a chiller hose or the like passes.

The movable electrical conductor 19 is provided to overlap with, when viewed from above, the outer peripheral end portions of the movable electrical conductor 17. The movable electrical conductor 19 is electrically connected to the movable electrical conductor 18 all the time. Further, the movable electrical conductor 19 can be moved in an axial direction (up and down direction), and it is electrically connected to the movable electrical conductor 16 when being elevated to the uppermost position.

A control of elevation mechanism of the movable electrical conductors 17 and 19, operations of various parts of the plasma processing apparatus, e.g., exhausts device 8, high frequency power supplies 12a and 12b, processing gas supply unit 29 and the like, and an overall operation (sequences) of the apparatus are controlled by controller not shown including, e.g., a microcomputer.

While the present invention has been shown and described with respect to the preferred embodiment, it is not limited to this embodiment, but can be modified. Particularly, a configuration of the movable power supply mechanism 30 may be properly selected or changed to be optimally combined with other mechanisms within the apparatus.

Further, the present invention is not limited to the plasma etching apparatus, but may be applied to other plasma processing apparatuses such as plasma CVD, plasma oxidation, plasma nitridation, sputtering or the like. Besides, in the present invention, a substrate to be processed is not limited to a semielectrical conductor wafer, but may be various substrates for flat panel displays, photomasks, CD substrates, print substrates or the like.

While the invention has been shown and described with respect to the embodiment, it will be understood by those skilled in the art that various changes and modifications may be made without departing from the scope of the invention as defined in the following claims.

What is claimed is:

1. A plasma processing apparatus performing a plasma processing to a substrate, comprising:
   a processing vessel having a vacuum exhaustable processing chamber;
   a mounting table serving as a lower electrode for mounting thereon the substrate in the processing chamber;
   a circular ring member arranged to surround a periphery of the substrate whose radial one end portion is supported by the mounting table;
   an upper electrode arranged above the lower electrode to face same;
   a power feed for supplying the mounting table with a high frequency power;
   a first intermediate electrical conductor supporting a middle portion of the circular ring member;

a first movable electrical conductor which selectively electrically connects or disconnects the first intermediate electrical conductor to the power feed; and a second intermediate electrical conductor supporting a radial opposite end portion of the circular ring member.

2. The plasma processing apparatus of claim 1, wherein the second intermediate electrical conductor is grounded, and the plasma processing apparatus further comprises a second movable electrical conductor which selectively electrically connects or disconnects the first intermediate electrical conductor to the second intermediate electrical conductor.

3. The plasma processing apparatus of claim 2, wherein the first and the second movable electrical conductor are disposed in a space inside the processing vessel, the space being hermetically isolated from the processing chamber.

4. The plasma processing apparatus of claim 2, wherein the first and the second movable electrical conductor are axially movable along the power feed.

5. The plasma processing apparatus of claim 2, wherein the first and the second movable electrical conductor are constructed as a single unit and are electrically isolated from each other by an insulator.

6. The plasma processing apparatus of claim 2, further comprising a movable mechanism moving the first and the second movable electrical conductor in unison.

7. The plasma processing apparatus of claim 2, wherein one or both of the first and the second movable electrical conductor include multiple contacts.

8. The plasma processing apparatus of claim 1, wherein the circular ring member includes a radially inner part and a radially outer part separated at the middle portion and the radially inner part includes an inner and an outer focus ring.

9. A plasma processing apparatus of claim 1, wherein the circular ring member includes a radially inner part and a radially outer part and the radially outer part is a pressing member of the radially inner part serving as a focus ring.

* * * * *